US 8,324,636 B2

(12) United States Patent
Hamaguchi et al.

(10) Patent No.: US 8,324,636 B2
(45) Date of Patent: Dec. 4, 2012

(54) METHOD AND APPARATUS FOR MANUFACTURING LED DEVICES USING LASER SCRIBING

(75) Inventors: Norihito Hamaguchi, Livermore, CA (US); Ghulam Hasnain, Livermore, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 12/906,349

(22) Filed: Oct. 18, 2010

(65) Prior Publication Data

US 2011/0031508 A1    Feb. 10, 2011

Related U.S. Application Data

(62) Division of application No. 12/434,208, filed on May 1, 2009.

(51) Int. Cl.
*H01L 33/00* (2010.01)

(52) U.S. Cl. ........ 257/79; 257/E21.596; 438/33; 438/68; 438/113; 438/462; 438/463; 219/121.67

(58) Field of Classification Search .......... 438/33, 438/68, 113, 462, 463; 257/103, E21.596, 257/79; 219/121.67
See application file for complete search history.

(56) References Cited

U.S. PATENT DOCUMENTS

| | | | |
|---|---|---|---|
| 2004/0232439 A1* | 11/2004 | Gibb et al. | 257/103 |
| 2005/0059183 A1* | 3/2005 | Nagai et al. | 438/33 |
| 2006/0160331 A1* | 7/2006 | Fukuyo et al. | 438/463 |
| 2007/0111480 A1* | 5/2007 | Maruyama et al. | 438/463 |
| 2008/0048172 A1* | 2/2008 | Muraki et al. | 257/13 |

* cited by examiner

*Primary Examiner* — A. Sefer
*Assistant Examiner* — Farid Khan
(74) *Attorney, Agent, or Firm* — JW Law Group; James M. Wu

(57) ABSTRACT

A method of manufacturing a light-emitting device using laser scribing to improve overall light output is disclosed. Upon placing a semiconductor wafer having light emitting diode ("LED") devices separated by streets on a wafer chuck, the process arranges a first surface of semiconductor wafer containing front sides of the LED devices facing up and a second surface of semiconductor wafer containing back sides of the LED devices facing toward the wafer chuck. After aligning a laser device over the first surface of the semiconductor wafer above a street, the process is configured to focus a high intensity portion of a laser beam generated by the laser device at a location in a substrate closer to the back sides of the LED devices.

20 Claims, 8 Drawing Sheets

METHOD AND APPARATUS FOR MANUFACTURING LED DEVICES USING LASER SCRIBING

PRIORITY

This patent application is a divisional patent application of U.S. patent application Ser. No. 12/434,208, filed May 1, 2009, entitled "Method and Apparatus for Manufacturing LED Devices using Laser Scribing" by Norihito Hamaguchi and Ghulam Hasnain, the disclosure of which is incorporated herein by reference.

FIELD

The exemplary aspect(s) of the present invention relates to lighting devices. More specifically, the aspect(s) of the present invention relates to manufacturing light-emitting devices based on semiconductor diodes using a transparent substrate.

BACKGROUND

Solid-state light-emitting devices such as light emitting diodes ("LEDs") are attractive candidates for replacing conventional light sources such as incandescent and fluorescent lamps. LEDs typically have substantially higher light conversion efficiencies than incandescent lamps, and have longer lifetimes than conventional light sources. Some types of LEDs have higher conversion efficiencies than fluorescent light sources and even higher conversion efficiencies have been demonstrated in the laboratory. For LEDs to be accepted in various lighting applications, it is important to optimize every step of the processing and achieve the highest efficiencies possible. The light conversion efficiency for an LED die is typically determined by the internal quantum efficiency and the light extraction efficiency. While the internal quantum efficiency is related to how efficiently the electrical current is converted to photons, the light extraction efficiency is related to how much of the produced photons can successfully escape or exit from the die. To fabricate an LED die, a wafer is processed by a semiconductor process through photolithographic steps and depositing and etching various metal, oxide, and nitride layers. The dicing or singulation of LED die is performed at the end of the wafer processing and is an important step that impacts the LED device performance in a number of ways.

A challenge associated with manufacturing or producing LED devices is to dice or separate LED devices from a typical semiconductor wafer. A conventional approach of separating a solid-state device or LED die from a semiconductor wafer is to employ a dicing mechanism such as diamond scribing and breaking. There are a number of drawbacks associated with diamond scribing. One drawback is low throughput partially due to the inherently slow scribing speed. Another drawback associated with the diamond scribing is the limitation of wafer thickness which is typically limited to about 100 µm. Furthermore, the diamond tool wears quickly and requires frequent replacement increasing the cost of manufacturing. When scribing the front side, the street, which is space used to separate LED devices from each other, is required to be free of GaN-based layers and needs to be wide enough to allow the tip of the diamond tool to scribe between the devices. When scribing the backside, the break through the bulk of substrate is not always well-controlled resulting in non-negligible chipping and cracks into the device structures causing significant yield loss.

Technological advancement in diode-pumped solid-state ("DPSS") laser enabled laser scribing has overcome some of the above-mentioned drawbacks and has become increasingly popular. However, the high energy exerted by the laser beam can negatively impact the device performance if laser scribing is not performed correctly. To avoid or minimize damage to the active regions of an LED device and maintain a high process yield, scribing has to be placed at the center of a sufficiently wide dicing street. Laser scribing can be done either on the epi/front side or on the substrate/back side.

Some LED chips have opaque metallization on the substrate back surface to facilitate die-attach with solder and/or to provide a mirror surface. The mirror surface is used to reflect internal light back from the mirror surface to the front side of LED device thereby increase overall efficiency of light extraction. However, the opaque metal coating on the back of the substrate creates a scribing problem since the front side of the devices can not be seen precisely from the backside; therefore, scribing lines on the backside can be risky. A conventional approach is to use a backside camera to view the front side while scribing is performed at the backside. Alternatively, scribing on dicing streets from the front side of device can be easily performed as the wafer is scribed. A drawback with the front alignment for laser scribing, however, is that it reduces light output due to the contamination over the lighting areas of the devices. One approach to reduce the front side contamination is to use a thin protective coating prior to laser scribing at the expense of added processing steps and complexity. When the cleaving/breaking along the street is initiated from the front side scribing, the backside metal does not separate precisely along the street. Due to the flexible nature of thin metal layers, some or all of the metal layers on the backside may simply bend while the substrate and the front-side epitaxial layers are completely separated after the breaking step. As a result, some dies may miss some metals while other dies may have extra metals hanging over from the neighboring die(s). These problems can degrade the LED device performance and cause yield loss. Furthermore, incomplete separation of the backside metal layer causes inconsistent and random spacing of dies when the tape is expanded for separation. Another drawback is that laser scribe can block light passage due to absorbing scribe walls created during the process of laser scribing in the vicinity of light emitting regions.

To reduce the drawbacks or problems relating to the contamination as well as absorbing scribe wall(s), a conventional process of laser scribing is performed at the back side of a wafer. To implement back side laser scribing, a second high resolution camera with precise alignment with the top side camera is installed under the wafer. In order to securely hold a wafer and allow the viewing of the front side, which is hidden from the top side due to the opaque backside metal on the substrate, the wafer holding chuck needs to be transparent and have holes to provide vacuum suction. Transparent wafer holding chuck and vacuum suction add complexity to the laser scribing system since the wafer chuck is moved while securely holding the wafer allowing the viewing of the wafer through the wafer holding chuck.

SUMMARY

In one aspect of the disclosure, a method of manufacturing a light-emitting device using laser scribing is disclosed. A semiconductor wafer is placed on a wafer chuck wherein the wafer contains light emitting diode ("LED") devices separated by streets. The process arranges a first surface of semiconductor wafer containing front sides of the LED devices facing up and a second surface of semiconductor wafer containing back sides of the LED devices facing toward the wafer chuck. After aligning a laser device over the first surface of the semiconductor wafer above a street, the process is configured to focus a high intensity portion of a laser beam at a location in a substrate closer to the back sides of the LED devices.

It is understood that other aspects of the present invention will become readily apparent to those skilled in the art from the following detailed description, wherein it is shown and described only exemplary configurations of an LED by way of illustration. As will be realized, the present invention includes other and different aspects and its several details are able to be modified in various other respects, all without departing from the spirit and scope of the present invention. Accordingly, the drawings and the detailed description are to be regarded as illustrative in nature and not as restrictive.

BRIEF DESCRIPTION OF THE DRAWINGS

The exemplary aspect(s) of the present invention will be understood more fully from the detailed description given below and from the accompanying drawings of various aspects of the invention, which, however, should not be taken to limit the invention to the specific aspects, but are for explanation and understanding only.

DETAILED DESCRIPTION

Figure 1:
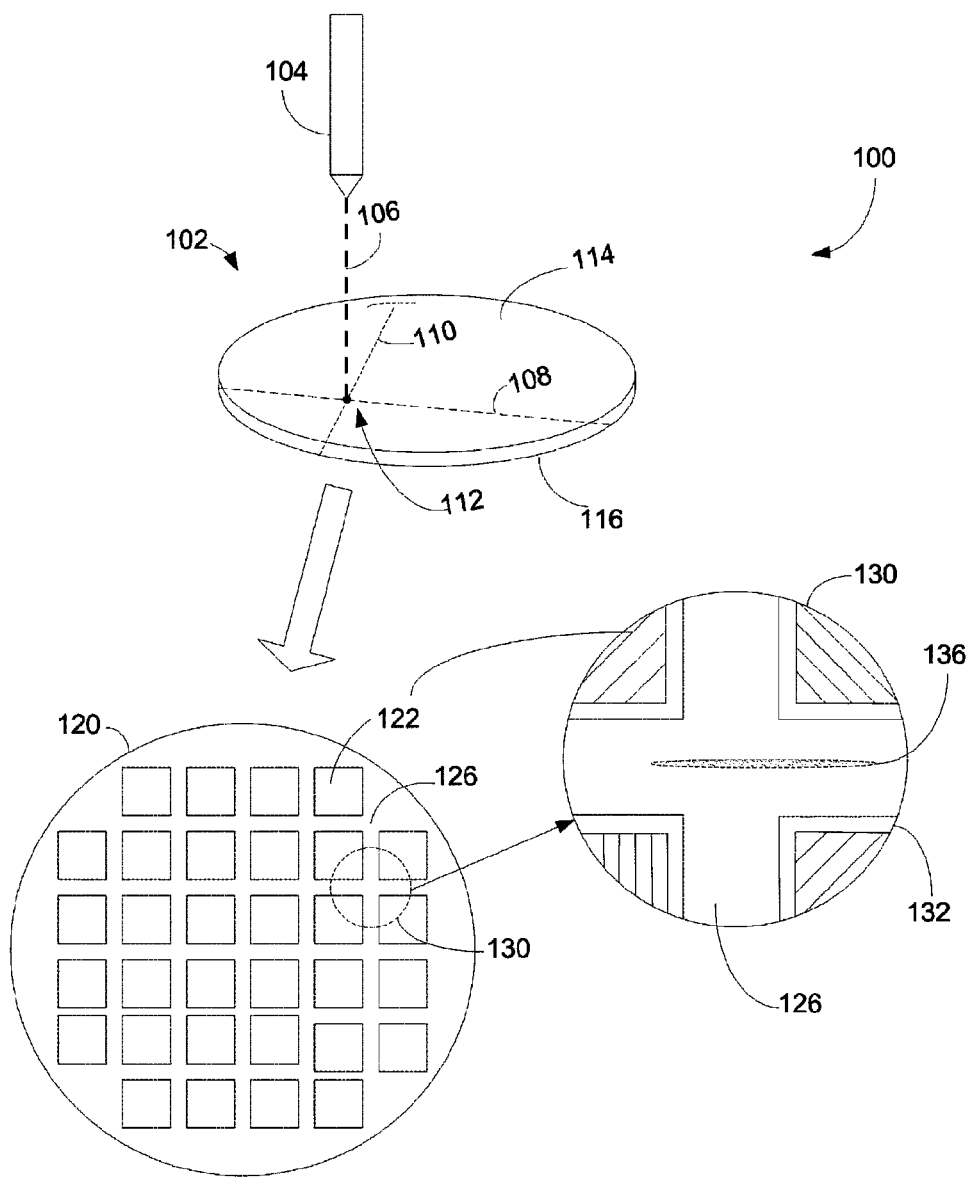
FIG. 1 is a block diagram illustrating a process of dicing a wafer containing LED devices using laser scribing in accordance with one aspect of the present invention.

Aspect(s) of the present invention is described herein in the context of a method, device, and apparatus of manufacturing LED devices employing laser scribe focusing a high intensity laser beam at a location closer to the back side of substrate.

The present invention is described more fully hereinafter with reference to the accompanying drawings, in which various aspects of the present invention are shown. This invention, however, may be embodied in many different forms and should not be construed as limited to the various aspects of the present invention presented throughout this disclosure. Rather, these aspects are provided so that this disclosure will be thorough and complete, and will fully convey the scope of the present invention to those skilled in the art. The various aspects of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method.

Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present invention.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower", can therefore, encompass both an orientation of "lower" and "upper," depending of the particular orientation of the apparatus. Similarly, if an apparatus in the drawing is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items Various aspects of an LED luminaire will be presented. However, as those skilled in the art will readily appreciate, these aspects may be extended to aspects of LED luminaires without departing from the invention. The LED luminaire may be configured as a direct replacement for conventional luminaires, including, by way of example, recessed lights, surface-mounted lights, pendant lights, sconces, cove lights, track lighting, under-cabinet lights, landscape or outdoor lights, flood lights, search lights, street lights, strobe lights, bay lights, strip lights, industrial lights, emergency lights, balanced arm lamps, accent lights, background lights, and other light fixtures.

As used herein, the term "light fixture" shall mean the outer shell or housing of a luminaire. The term "luminaire" shall mean a light fixture complete with a light source and other components (e.g., a fan for cooling the light source, a reflector for directing the light, etc.), if required. The term "LED luminaire" shall mean a luminaire with a light source comprising one or more LEDs. LEDs are well known in the art, and therefore, will only briefly be discussed to provide a complete description of the invention.

It is further understood that the aspect of the present invention may contain integrated circuits that are readily manufacturable using conventional semiconductor technologies, such as CMOS ("complementary metal-oxide semiconductor") technology, or other semiconductor manufacturing processes. In addition, the aspect of the present invention may be implemented with other manufacturing processes for making optical as well as electrical devices. Reference will now be made in detail to implementations of the exemplary aspect(s) as illustrated in the accompanying drawings. The same reference indicators will be used throughout the drawings and the following detailed description to refer to the same or like parts.

An aspect of the present invention discloses a method and an apparatus of dicing an LED device(s) from a semiconductor wafer using a laser scribing technique. The technique places a semiconductor wafer on a wafer chuck wherein the wafer contains LED devices separated by streets. A process of the technique arranges a top surface of semiconductor wafer containing front sides of the LED devices facing up and another surface of the wafer containing back sides of the LED devices facing toward the wafer chuck. After aligning a laser device over the top surface of the semiconductor wafer above a street, the process is configured to focus a high intensity portion of a laser beam at a location in a substrate closer to the back sides of the LED devices.

FIG. 1 is a block diagram 100 illustrating a process of dicing a wafer containing LED devices using laser scribing in accordance with one aspect of the present invention. Diagram 100 includes a semiconductor wafer 102 and a laser device 104 wherein semiconductor wafer 102 has a front side 114 and a back side 116. Laser device 104 provides light beam or laser beam 106 to scribe semiconductor wafer 102. Note that laser beam 106 is guided to enter front side 114 of wafer 102 to weaken (or scribing or breaking) at least a portion of crystal lattice 112 inside of a substrate. In one aspect, the portion of crystal lattice 112 is located closer to back side 116 of semiconductor wafer 102. It should be noted that the underlying concept of the exemplary aspect(s) of the present invention would not change if one or more elements (or layers) were added to or removed from diagram 100.

Semiconductor wafer 102, in one aspect, includes a device layer containing multiple LED devices 122, wherein each LED device 122 is separated or spaced by streets 126 as depicted in a top-view wafer 120. When laser beam 106 enters the front side location 130 and travels in the substrate for a distance before the light converges at point 112, light converges at point 112 and its intensity becomes high enough to cause the laser beam to be absorbed in the localized area of the substrate leading to the destruction of the crystal lattice at a point or location 112. The laser scribing creates a breakage or scribing line 136 at crystal or lattice level of the substrate situated closer to the back side 116 of wafer 102. In one aspect, the laser beam 106 travels through the medium of the substrate before it reaches the focal point or point 112 without occurrence of photon absorption. The laser wavelength, power, pulse duration, and repetition rate is carefully chosen based on the interaction between the laser beam and the wafer material to realize the effect of present invention. The laser beam power is sufficient to allow the efficient transfer of laser energy to take place at the focal point and its vicinity where the laser beam is focused. The intensity of the laser beam, however, is low enough to avoid unintended significant transfer of laser energy at the entry point where the laser beam is not focused. Therefore, the focal point 112 should be sufficiently away from the surface relative to the focal length of the lens.

Laser device 104, in one aspect, includes a laser and a set of optical lenses, not shown in FIG. 1, wherein the laser generates laser beam and the optical lens creates a high intensity beam at a focused area, which may be a focal length away from the optical lens. Laser beam 106 is configured to include a low intensity portion and a high intensity portion wherein the low intensity portion can pass through the medium of semiconductor wafer without occurrence of photon absorption by the medium. The high intensity portion of laser beam, on the other hand, is generated by a focusing mechanism such as a lens to converge low intensity beam into high intensity beam at a particular point or focal point as such area 112.

Diagram 100 illustrates a relationship between semiconductor wafer 102 and laser device 104 wherein wafer 102 is mounted on a wafer chuck and laser beam 106 can be scanned on wafer 102. Semiconductor wafer 102, for example, is mounted on a wafer chuck with the layer containing LED devices facing upward while back side of semiconductor wafer 102 containing metal layer(s) faces toward the wafer chuck. The laser beam is focused or converged at an area or location inside the substrate such as a sapphire substrate wherein the location is relatively closer to the metal layer of wafer 102 and is scanned along the street(s).

The aspect of present invention offers a relatively easy and accurate alignment of the front side features without causing the front side to be contaminated by the laser-scribing debris and without extra overhanging or missing backside metal layers commonly seen in front-side scribing. Note that the laser scribing related debris is substantially reduced or eliminated on the front side of wafer because the scribe lines or marks are formed on the back side of wafer 102. An advantage of creating a scribing line located inside of the substrate of wafer 102 is that the dicing process does not require depositing a protective coating on the front side of wafer. Since the protective coating is avoided, the steps of removing such protective coating, and/or cleaning such protective coating after scribing are also avoided or reduced. Since the breaking/cleaving of the wafer is initiated from the backside in the subsequent breaking step, it ensures that the backside metal layers are cleanly separated minimizing the overhanging or missing metal layers in singulated die.

Another advantage of wafer scribing closer to the back side of the substrate or wafer is to cause sidewall(s) of scribe line to be formed away from the light emitting region of LED devices, as such the sidewalls situated away from the light region reduce the light absorption for the device(s). Furthermore, since the absorption of the laser beam takes place further from the critical semiconductor device regions than in the case with a conventional front-side scribing, the aspect(s) of the present invention reduces the risk of negatively impacting device performance during the process of scribing.

Figure 2:
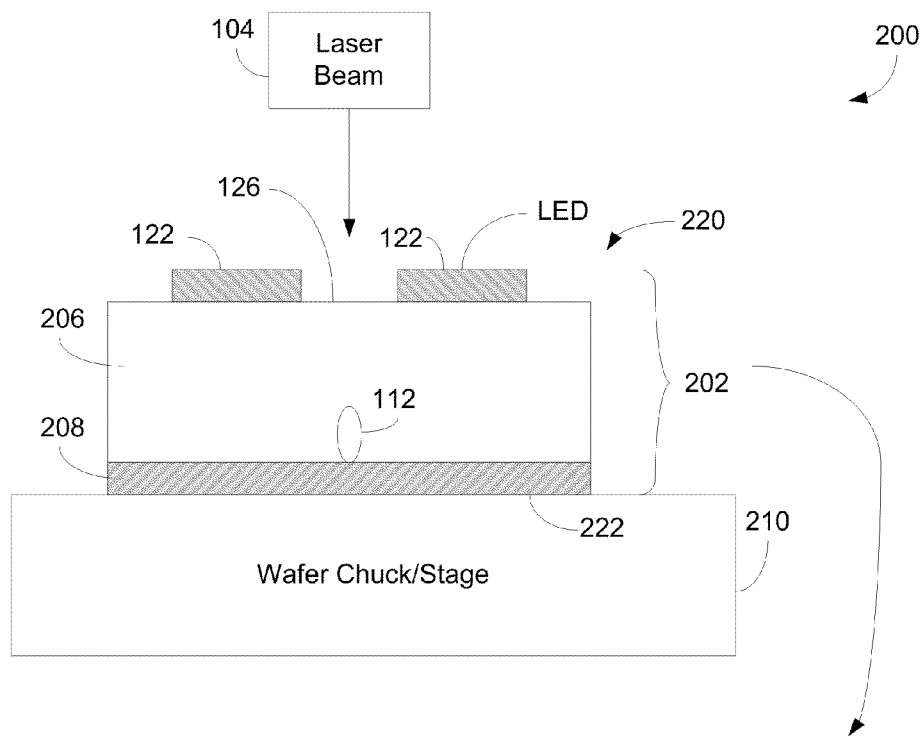
FIG. 2 is a block diagram illustrating an optical photograph showing a result of laser scribing the backside with the frontside laser exposure in accordance with one aspect of the present invention.
Figure 2:
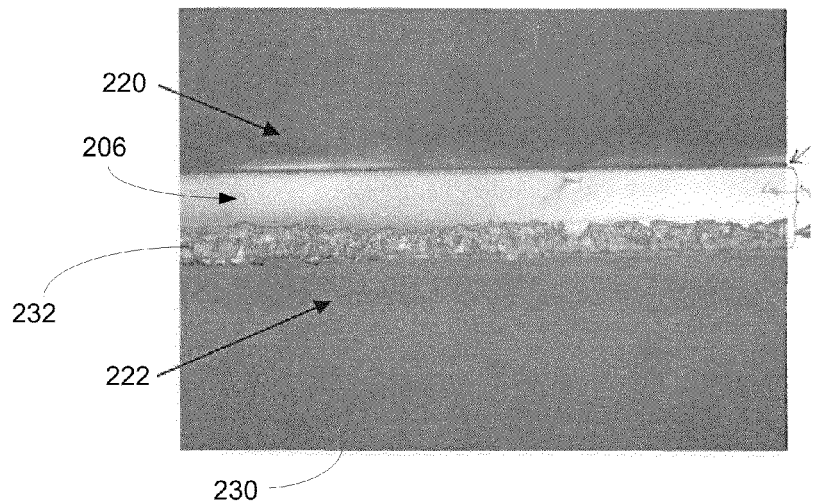

FIG. 2 is a block diagram 200 illustrating a process of separating LED devices from a wafer using laser scribing in accordance with one aspect of the present invention. Diagram 200 includes a laser device 104, a semiconductor wafer 202, and a wafer chuck or stage 210. Semiconductor wafer 202 includes a device layer 122, a substrate 206, and a metal layer 208, wherein wafer 202 has a front side 220 and a back side 222. It should be noted that the underlying concept of the exemplary aspect(s) of the present invention would not change if one or more elements (or layers) were added to or removed from diagram 200.

Device layer 122 includes LED devices and various streets used to divide LED devices from each other on wafer 202. Various LED devices, for instance, are deposited over substrate 206. Substrate 206, in one aspect, is a sapphire substrate which is transparent materials. After a backside thinning process substrate 206 is further coated by a metal layer 208, wherein metal layer 208 may further include a metal mirror sub-layer and a gold sub-layer. The metal mirror sub-layer is used to redirect light to the light openings and it can be made of aluminum materials or other types of alloys. In one aspect, laser device 104 generates a laser beam capable of focusing at an internal area 112 of substrate 206 located toward back side 222 of semiconductor wafer 202.

During an operation, laser device 104 is positioned or aligned over a street 126 and is capable of focusing its high intensity portion of the laser beam at internal area or location 112 inside substrate 206. Upon activating laser device 104, a laser beam emitted from laser device 104 enters front side 220 of semiconductor wafer 202 and travels through a distance in the medium of substrate 206 without loss of photons or without occurrence of a phenomenon of photon absorption. Upon arrival area or location 112, laser beam converges reaching the necessary intensity for photon absorption and it scribes, breaks, or weakens crystal lattice to create a scribing line at location 112 in substrate 206. Since the breakage or scribing line is created relatively closer to the back side of the wafer, scribing debris or scribing walls generated during the laser scribing will be reduced in areas around light emitting region(s) such as front side 220 of wafer 202.

Diagram 230 illustrates an exemplary cross-section view of semiconductor wafer 202 after operation of laser scribing. Diagram 230 includes a front side 220, a back side 222, and a substrate 206. Between substrate 206 and back side 222, an area 232 illustrates a scribing line as well as scribing debris generated by the laser scribing. It should be noted that the debris and contaminations are located around area 232, which is away from front side 220.

Figure 3:
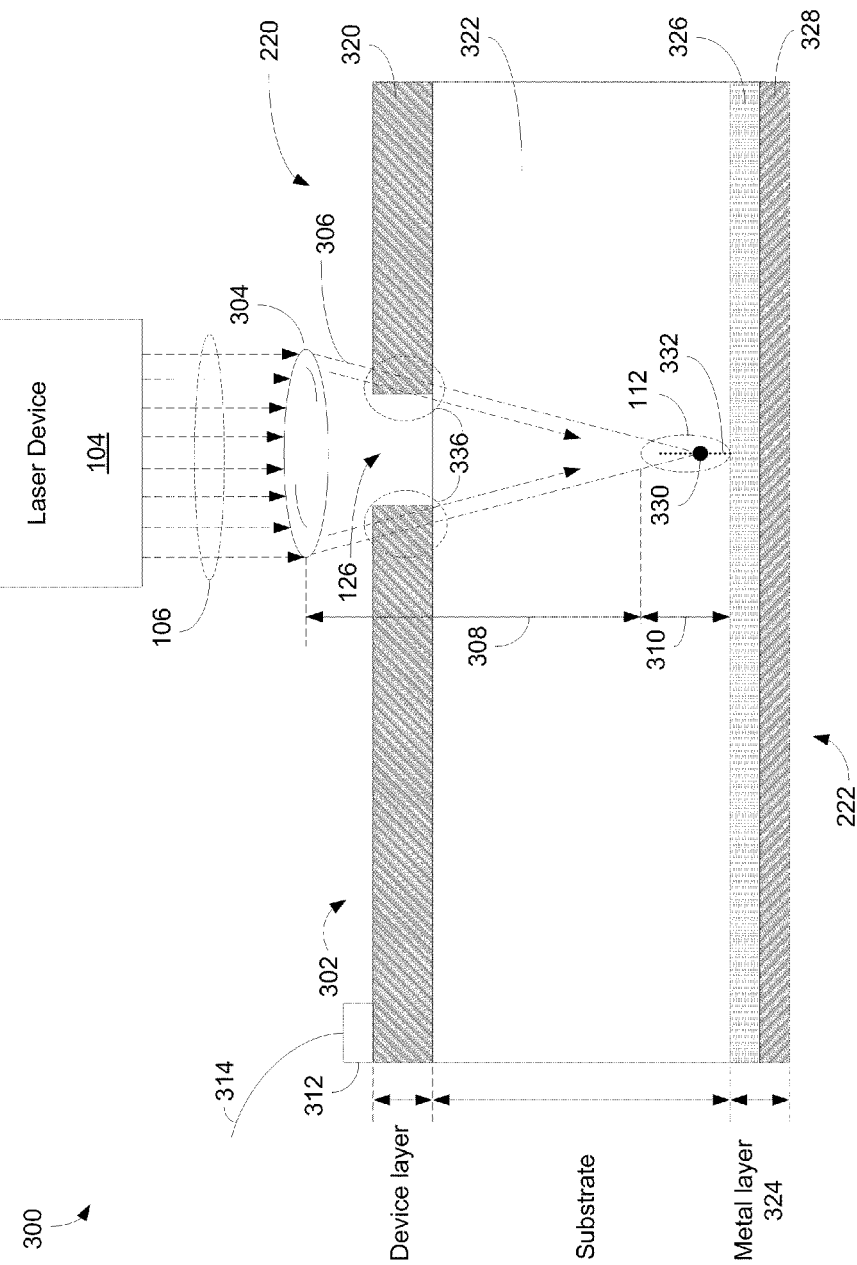
FIG. 3 is a block diagram illustrating a process of laser scribing at the back side of the wafer in accordance with one aspect of the present invention.

FIG. 3 is a block diagram 300 illustrating a process of laser scribing at the back side of the wafer in accordance with one aspect of the present invention. Diagram 300 includes a laser device 104, a semiconductor wafer 302, and an optical lens 304 wherein optical lens 304 can be a part of laser device 104. When a laser beam 106 is generated or formed by laser device 104, optical beam 106 is controlled and/or guided by optical lens 304. Optical lens 304 redirects (or converges) light or optical beam 106 over a distance determined by the focal length of the lens and the refractive index of the medium, i.e., the substrate to provide high intensity laser beam at location 112. Location or area 112 is situated inside substrate 322 closer to back side 222 of semiconductor wafer 302. In other words, optical lens 304 converges a low intensity laser beam into a high intensity laser beam at a focal point 330. It should be noted that the underlying concept of the exemplary aspect(s) of the present invention would not change if one or more elements (or layers) were added to or removed from diagram 300.

Semiconductor wafer 302 includes a device layer 320, a substrate 322, and a metal layer 324 wherein metal layer 324 further contains a metal mirror sub-layer 326 and a gold sub-layer 328. Device layer 320 is configured to receive a contact 312 and exemplary contact wire 314 can be used to connect to external device(s) or circuitry. Device layer 320, for example, may include various LED devices and is deposited over substrate 322. The thickness of device layer 320 is approximately one (1) micrometer ("µm") and the thickness of substrate 322 can have a range between 60 to 400 µm. Substrate 322 can either be made of silicon carbide (SiC), sapphire ($Al_2O_3$), or other materials having similar physical properties. The thickness of metal layer 324, on the other hand, is approximately 1 µm. As such, the majority thickness of semiconductor wafer 302 is substrate 322.

Laser beam 306, in one aspect, can be any wavelengths wherein some light beams are transparent to certain materials. For example, a laser beam may be capable of passing through transparent sapphire materials of substrate 322 with minimum loss of photons. When laser beam 306 is calibrated at relatively low-intensity, it can pass or penetrate various solid-state materials without occurrence of photon absorption. Note that the solid-state materials can be sapphire ($Al_2O_3$) and/or gallium nitride (GaN). For example, a portion of device layer 320 may include a GaN layer at device layer 320. When a portion of low intensity laser beam 306 passes through areas 336 next to street 126, light or photon absorption is not likely to occur at areas 336 because the intensity of beam 306 is too low to incur any photon loss.

When laser beam 306 travels a distance or a focal distance 308 in the medium of substrate 322 and reaches location 112, laser beam 306 turns into high intensity light beam due to the convergence of the light facilitated by optical lens 304. When a beam reaches sufficient intensity such as laser beam at point 330, a nonlinear optical phenomenon such as multi-photon absorption takes place. When two or more photons assist each other, a nonlinear optical phenomenon, for instance, causes local crystal lattice susceptible to nonlinear high-order photon absorption which introduces localized heat associated with photon absorption. The locally generated heat melts, evaporates, disassociates, breaks crystal lattice such as sapphire ($Al_2O_3$). In the case of laser scribing a sapphire wafer with a 355 nm UV laser, three-photon absorption is required. In one aspect, the locally generated heat caused by high intensity laser beam 306 can create gashing, breaking, and/or acoustic wave in crystal lattice inside substrate 322. During the laser scribing, scribing debris, deteriorated crystal lattice, and/or contaminated materials are left around scribing line 332 in the vicinity area 112.

During a dicing operation, optical lens 304 can be used to focus a high intensity laser beam at an area of 112 near or closer to back side 222 of wafer 302. When laser beam 106 converges at area of 112 at focal point 330, the light becomes a high intensity laser beam capable of scribing, cutting, or weakening the crystal lattice at point 330. After laser scribe, scribing line 332 is used to induce a breakage along a crystal line parallel to a street for dicing LED dies from a wafer. It should be noted that GaN-based semiconductor is more absorbing to a laser beam because of the smaller bandgap than that of sapphire. Therefore, the street between the LED devices where the GaN-based semiconductor layers are etched away should be sufficiently wide relative to the target scribing depth to effectively focus the laser beam at the target scribing location. Even if laser beam 306 entered GaN layer at area 336 is relatively weak and does not cause any absorption in sapphire, it can still be absorbed in the GaN-based semiconductor layer.

An advantage of an aspect of present invention is to use a laser scribe to dice LED dies from a metal-coated InGaN LED wafer deposited over a sapphire substrate through the frontside without using complicated and/or expensive system. In addition, the aspect of the present invention discloses a method of laser scribing that does not leave laser-scribing debris in the vicinity of light emitting regions of a device layer and offers a means of producing a clean separation of the backside metal coating.

The exemplary aspect of the present invention includes various processing steps, which will be described below. The steps of the aspect may be embodied in machine or computer executable instructions. The instructions can be used to cause a general purpose or special purpose system, which is programmed with the instructions, to perform the steps of the exemplary aspect of the present invention. Alternatively, the steps of the exemplary aspect of the present invention may be performed by specific hardware components that contain hard-wired logic for performing the steps, or by any combination of programmed computer components and custom hardware components.

Figure 4:
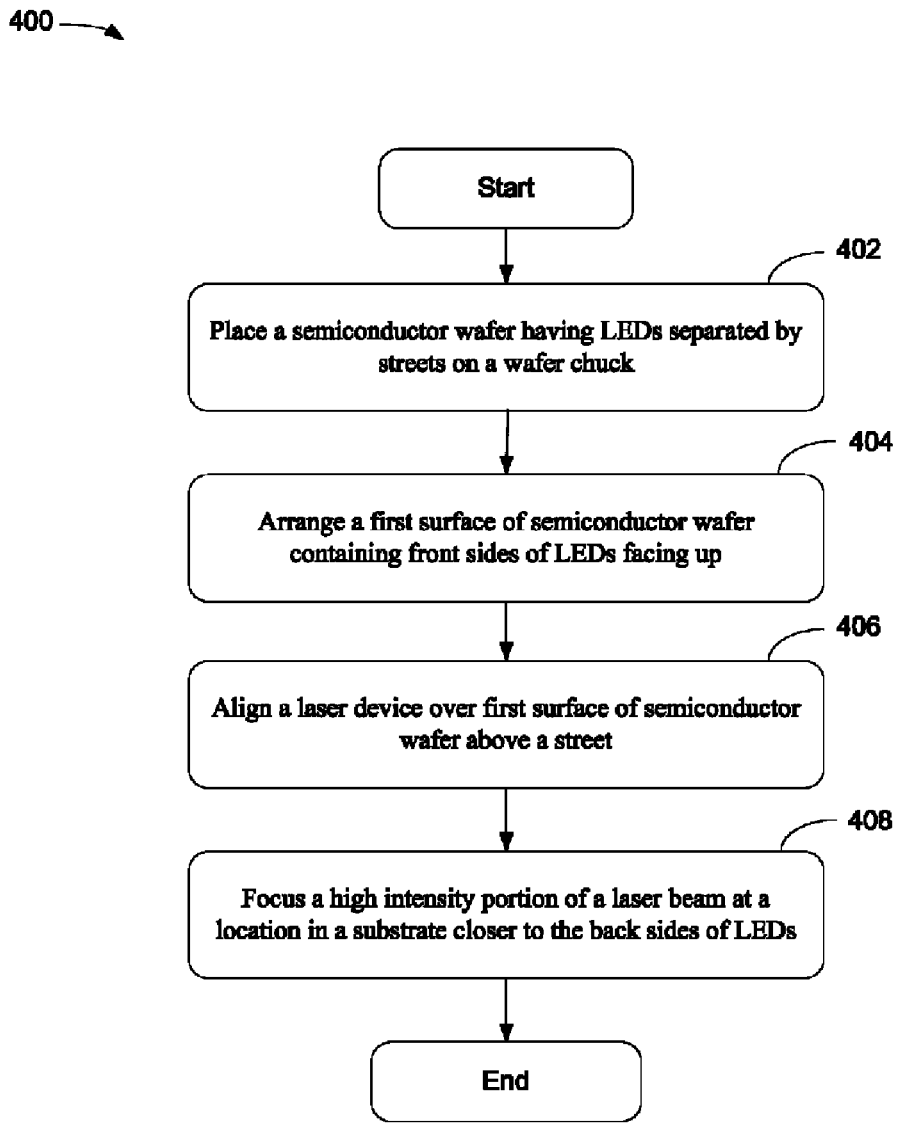
FIG. 4 is a flowchart illustrating a process of focusing a high intensity laser beam at the back side of the wafer in accordance with one aspect of the present invention.

FIG. 4 is a flowchart 400 illustrating a process of focusing a high intensity laser beam at the back side of the wafer in accordance with one aspect of the present invention. At block 402, a process of manufacturing a light-emitting device places a semiconductor wafer having LED devices separated by streets on a wafer chuck, stage, or housing. In an aspect, upon depositing an n-type semiconductor layer over a substrate, the process is configured to deposit an active layer over the n-type semiconductor layer to convert electrical energy to light. After depositing a p-type semiconductor layer over the active layer to form an LED device layer, the process deposits an electrically conductive layer over the p-type semiconductor layer for current spreading to form a semiconductor wafer. In addition, the process also deposits a metal layer over the backside of the sapphire substrate to form the back sides of the LEDs or semiconductor wafer.

At block 404, the process arranges a first surface of semiconductor wafer containing LEDs facing upward for light entry. A second surface of semiconductor wafer containing a metal layer is arranged to face toward the wafer chuck.

At block 406, a laser device is positioned or aligned over the first surface of the semiconductor wafer above a street. In an aspect the vertical position of the wafer is adjusted to place the focal position of the laser beam within the substrate close to the backside. In another aspect, the process can be further capable of adjusting light converging angle of the laser beam to calibrate the location to receive the high intensity laser beam.

At block 408, a high intensity portion of a laser beam generated by the laser device is focused at a location in a substrate closer to the back sides of the semiconductor wafer wherein the laser beam enters from the front side of semiconductor wafer to reach the location. The process allows the high intensity portion of the laser beam to focus at the location to destroy at least a portion of crystal lattice at the location under the street toward the back side of the semiconductor wafer. The laser beam is allowed to enter from the front side of the LEDs without substantial photon absorption. The laser beam is permitted to penetrate at least a portion of substrate without losing photons or substantial amount of photons. In an aspect, the process is capable of focusing the high intensity laser beam at the location having a range between 0 to 100 μm from the metal layer. In another aspect, the process is capable of focusing the high intensity laser beam at a location inside the substrate located at least 30 μm away from the front sides of LEDs.

Figure 5:
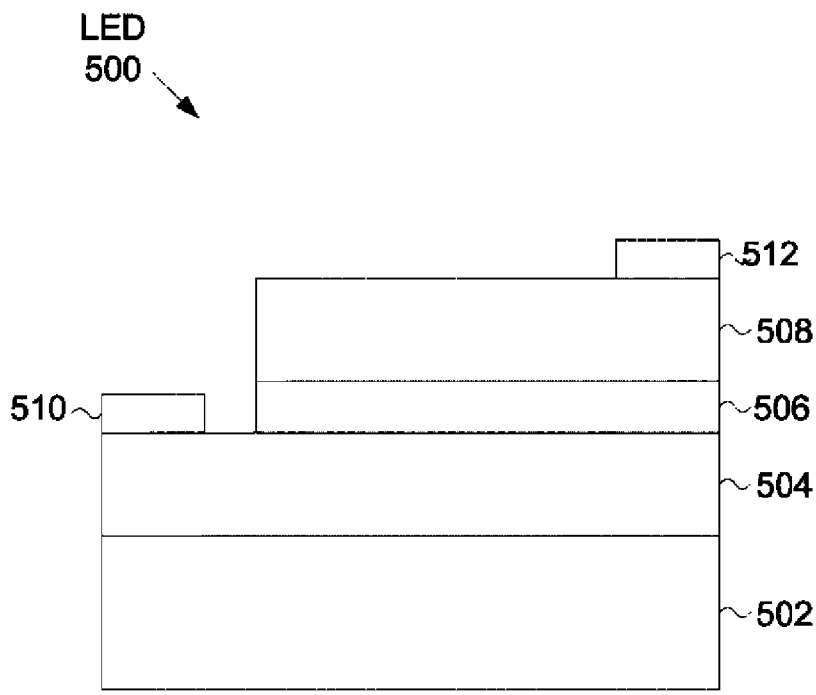
FIG. 5 is a conceptual cross-sectional view illustrating an example of an LED.

FIG. 5 is a conceptual cross-sectional view illustrating an exemplary fabrication process of an LED or LED devices. An LED is a semiconductor material impregnated, or doped, with impurities. These impurities add "electrons" or "holes" to the semiconductor, which can move in the material relatively freely. Depending on the kind of impurity, a doped region of the semiconductor can have predominantly electrons or holes, and is referred respectively as n-type or p-type semiconductor regions. Referring to FIG. 5, the LED 500 includes an n-type semiconductor region 504 and a p-type semiconductor region 508. A reverse electric field is created at the junction between the two regions, which cause the electrons and holes to move away from the junction to form an active region 506. When a forward voltage sufficient to overcome the reverse electric field is applied across the p-n junction through a pair of electrodes 510, 512, electrons and holes are forced into the active region 506 and recombine. When electrons recombine with holes, they fall to lower energy levels and release energy in the form of light.

In this example, the n-type semiconductor region 504 is formed on a substrate 502 and the p-type semiconductor region 508 is formed on the active layer 506, however, the regions may be reversed. That is, the p-type semiconductor region 508 may be formed on the substrate 502 and the n-type semiconductor region 504 may formed on the active layer 506. As those skilled in the art will readily appreciate, the various concepts described throughout this disclosure may be extended to any suitable layered structure. Additional layers or regions (not shown) may also be included in the LED 500, including but not limited to buffer, nucleation, contact and current spreading layers or regions, as well as light extraction layers.

The p-type semiconductor region 508 is exposed at the top surface, and therefore, the p-type electrode 512 may be readily formed thereon. However, the n-type semiconductor region 504 is buried beneath the p-type semiconductor layer 508 and the active layer 506. Accordingly, to form the n-type electrode 510 on the n-type semiconductor region 504, a cutout area or "mesa" is formed by removing a portion of the active layer 506 and the p-type semiconductor region 508 by means well known in the art to expose the n-type semiconductor layer 504 there beneath. After this portion is removed, the n-type electrode 510 may be formed.

Figure 6:
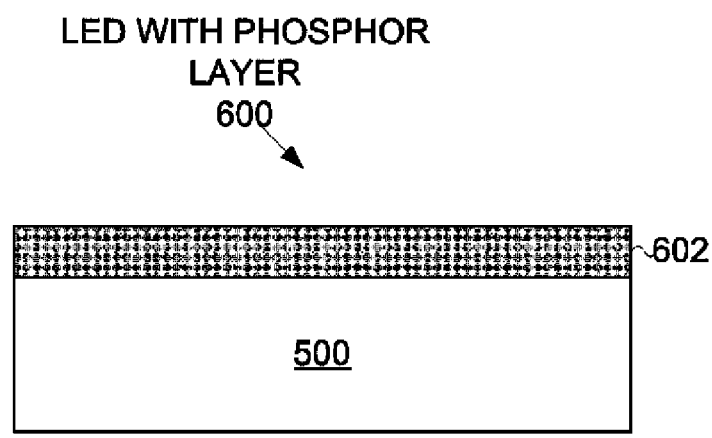
FIG. 6 is a conceptual cross-sectional view illustrating an example of an LED with a phosphor layer.

FIG. 6 is a conceptual cross-sectional view illustrating an example of an LED with a phosphor layer. In this example, a phosphor layer 602 is formed on the top surface of the LED 500 by means well known in the art. The phosphor layer 602 converts a portion of the light emitted by the LED 500 to light having a different spectrum from that emitted from the LED 500. A white LED light source can be constructed by using an LED that emits light in the blue region of the spectrum and a phosphor that converts blue light to yellow light. A white light source is well suited as a replacement lamp for conventional luminaries; however, the invention may be practiced with other LED and phosphor combinations to produce different color lights. The phosphor layer 602 may include, by way of example, phosphor particles suspended in a carrier or be constructed from a soluble phosphor that is dissolved in the carrier.

Figure 7A:
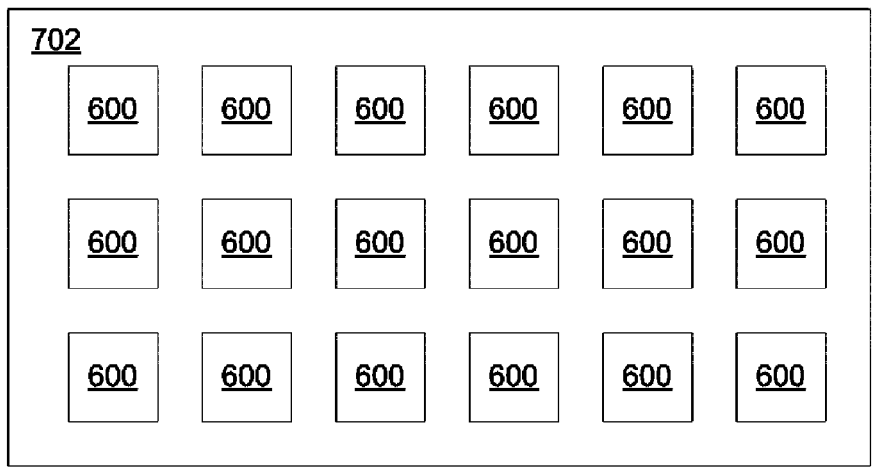
FIG. 7A is a conceptual top view illustrating an example of an LED array.
Figure 7B:
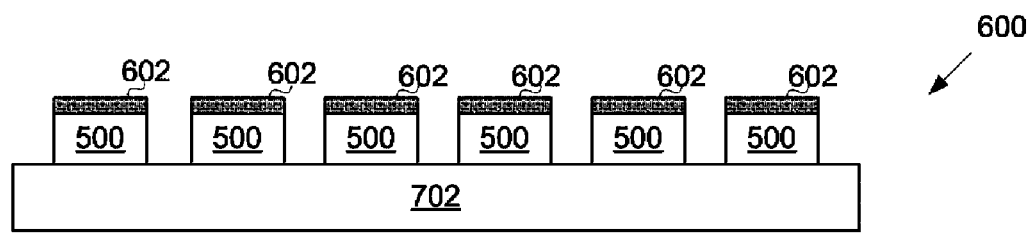
FIG. 7B is a conceptual cross-sectional view of the LED array of FIG. 7A.

In a configuration of LED luminaries, an LED array may be used to provide increased luminance. FIG. 7A is a conceptual top view illustrating an example of an LED array, and FIG. 7B is a conceptual cross-sectional view of the LED array of FIG. 7A. In this example, a number of phosphor-coated LEDs 600 may be formed on a substrate 702. The bond wires (not shown) extending from the LEDs 600 may be connected to traces (not shown) on the surface of the substrate 702, which connect the LEDs 600 in a parallel and/or series fashion. Typically, the LEDs 600 may be connected in parallel streams of series LEDs with a current limiting resistor (not shown) in each stream. The substrate 702 may be any suitable material that can provide support to the LEDs 600 and can be mounted within a light fixture (not shown).

Figure 8A:
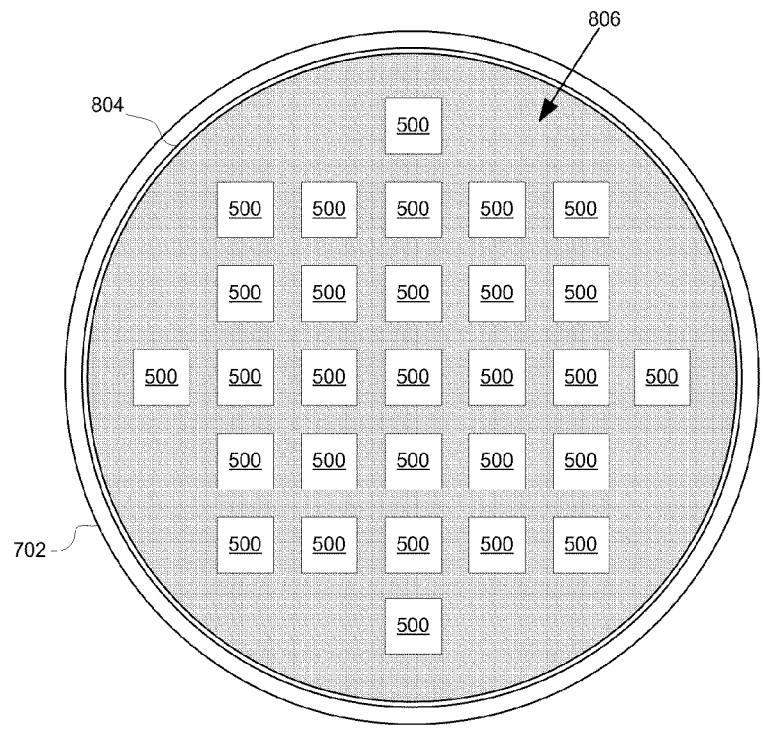
FIG. 8A is a conceptual top view illustrating an example of an alternative configuration of an LED array.
Figure 8B:
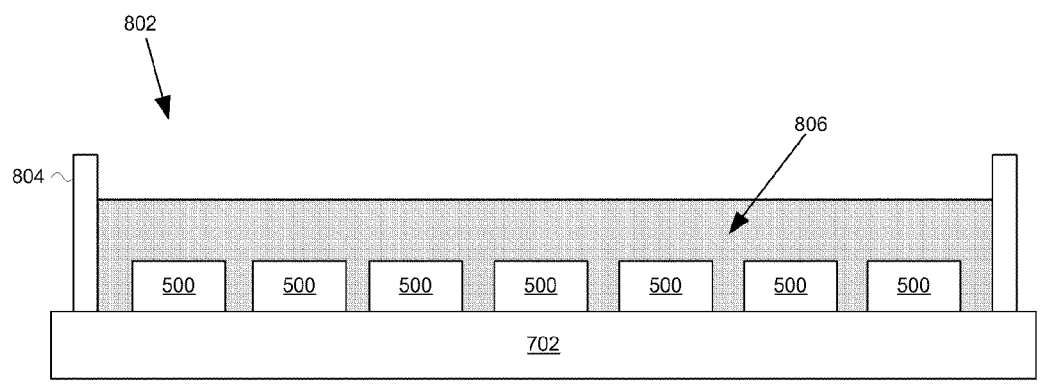
FIG. 8B is a conceptual cross-sectional view of the LED array of FIG. 8A.

FIG. 8A is a conceptual top view illustrating an example of an alternative configuration of an LED array, and FIG. 8B is a conceptual cross-sectional view of the LED array of FIG. 8A. In a manner similar to that described in connection with FIGS. 7A and 7B, a substrate 702 designed for mounting in a light fixture (not shown) may be used to support an array of LEDs 500. However, in this configuration, a phosphor layer is not formed on each individual LED. Instead, phosphor 806 is deposited within a cavity 802 bounded by an annular ring 804 that extends circumferentially around the outer surface of the substrate 702. The annular ring 804 may be formed by boring a cylindrical hole in a material that forms the substrate 702. Alternatively, the substrate 702 and the annular ring 804 may be formed with a suitable mold, or the annular ring 804 may be formed separately from the substrate 702 and attached to the substrate using an adhesive or other suitable means. In the latter configuration, the annular ring 804 is generally attached to the substrate 702 before the LEDs 500, however, in some configurations, the LEDs may be attached first. Once the LEDs 500 and the annular ring 804 are attached to the substrate 702, a suspension of phosphor particles in a carrier may be introduced into the cavity 802. The carrier material may be an epoxy or silicone, however, carriers based on other materials may also be used. The carrier material may be cured to produce a solid material in which the phosphor particles are immobilized.

Figure 9:
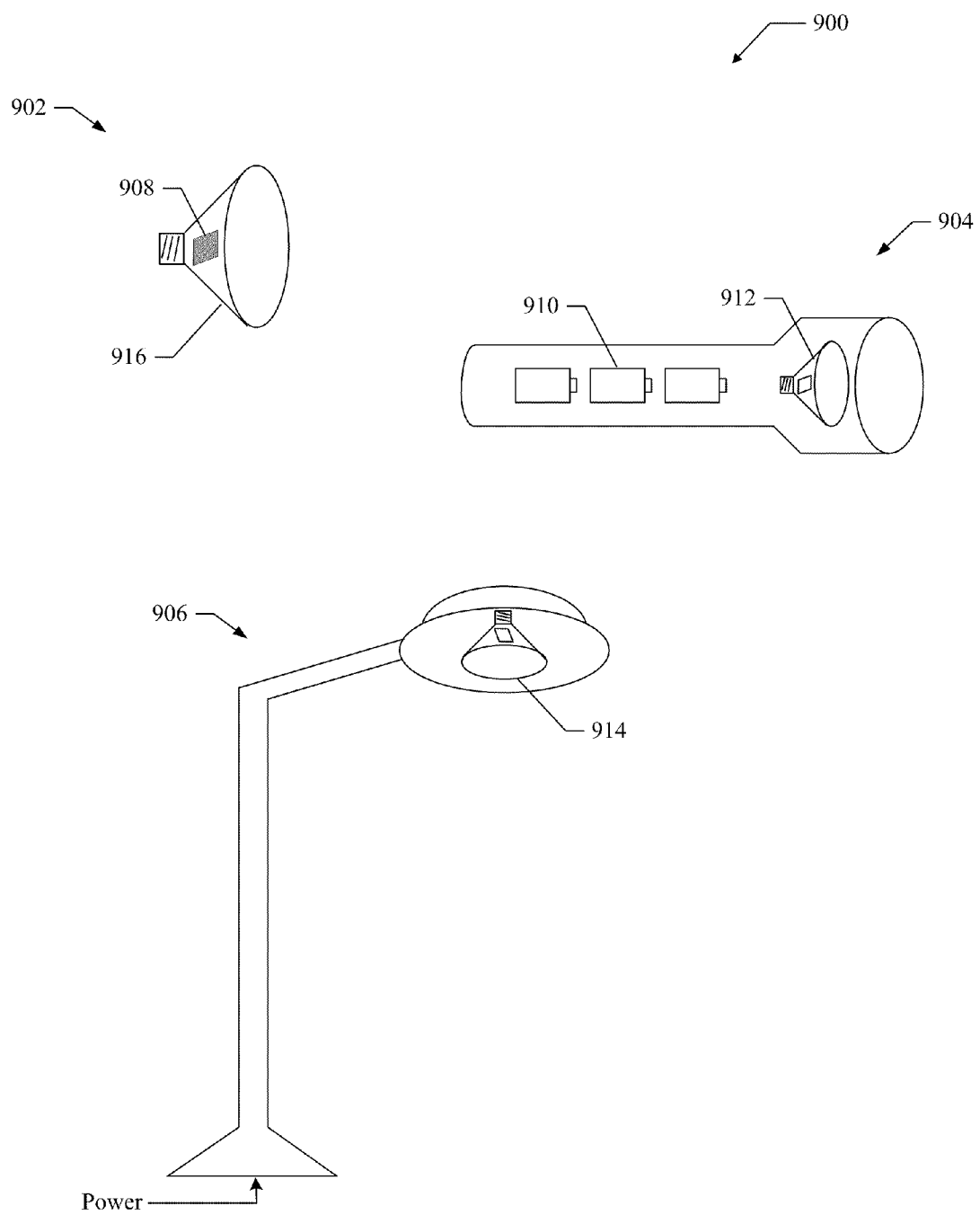
FIG. 9 shows exemplary devices including LEDs or LED devices manufactured by laser scribing in accordance with aspects of the present invention.

FIG. 9 shows exemplary devices including LEDs or LED devices manufactured by laser scribing in accordance with aspects of the present invention. The devices 900 include a lamp 902, an illumination device 904, and a street light 906. Each of the devices shown in FIG. 9 includes at least an LED or an LED device separated via a technique of laser scribing as described herein. For example, lamp 902 includes a package 916 and an LED 908, in which LED 908 is separated using a laser scribing at a location toward the back side of the device. Lamp 902 may be used for any type of general illumination. For example, lamp 902 may be used in an automobile headlamp, street light, overhead light, or in any other general illumination application. Illumination device 904 includes a power source 910 that is electrically coupled to a lamp 912, which may be configured as lamp 902. In an aspect, power source 910 may be batteries or any other suitable type of power source, such as a solar cell. Street light 906 includes a power source connected to a lamp 914, which may be configured as lamp 902. It should be noted that aspects of the LED described herein are suitable for use with virtually any type of LED assembly, which in turn may be used in any type of illumination device and are not limited to the devices shown in FIG. 9.

The various aspects of this disclosure are provided to enable one of ordinary skill in the art to practice the present invention. Various modifications to aspects presented throughout this disclosure will be readily apparent to those skilled in the art, and the concepts disclosed herein may be extended to other LED lamp configurations regardless of the shape or diameter of the glass enclosure and the base and the arrangement of electrical contacts on the lamp. Thus, the claims are not intended to be limited to the various aspects of this disclosure, but are to be accorded the full scope consistent with the language of the claims. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An apparatus for laser scribing, comprising:
   a semiconductor wafer including,
      a light emitting diode ("LED") layer wherein the LED layer is disposed on a front side of semiconductor wafer;
      a substrate layer coupled to the LED layer;
      a metal layer coupled to the substrate layer, wherein the metal layer is disposed on a back side of the semiconductor wafer; and
   a laser device situated above the front side of the semiconductor wafer configured to guide a laser beam entering from the front side of the semiconductor wafer, wherein a high intensity laser beam is focused to an area inside the substrate layer located near the back side of the semiconductor wafer, wherein at least a portion of the laser beam penetrates an active portion of an LED device without substantially changing performance of the LED device.

2. The apparatus of claim 1, wherein the high intensity portion of the laser beam is capable of destroying at least a portion of crystal lattice of the area.

3. The apparatus of claim 1, wherein the LED layer includes a plurality of LED devices deposited over the substrate layer separated by a plurality of streets.

4. The apparatus of claim 3, wherein the LED layer includes:
   a first conductive layer deposited over the substrate layer;
   an active layer deposited over the first conductive layer and configured to convert electrical energy to light; and
   a second conductive layer having a first surface overlying the active layer and a second surface opposite to the first surface to form a light-emitting semiconductor.

5. The apparatus of claim 4,
   wherein the first conductive layer is an n-type indium gallium nitride ("InGaN") layer; and
   wherein the second conductive layer is a p-type InGaN layer.

6. The apparatus of claim 4,
   wherein the first conductive layer is an n-type gallium nitride ("GaN") layer; and
   wherein the second conductive layer is a p-type GaN layer.

7. The apparatus of claim 1, wherein the substrate layer is made of sapphire material having a range of thickness between 50 to 400 micrometers.

8. The apparatus of claim 1, wherein the metal layer coupled to the substrate layer includes aluminum mirror sub-layer and a silver sub-layer.

9. The apparatus of claim 1, wherein the laser beam entering from the front side of the semiconductor wafer is configured to travel through at least a portion of the substrate without substantial photon absorption.

10. The apparatus of claim 2, wherein the portion of crystal lattice of the substrate layer closer to the metal layer is situated between 0 to 50 micrometers from the metal layer.

11. An LED lamp capable of providing light comprising an LED manufactured by an apparatus of claim 1.

12. A laser cutting system, comprising:
- a semiconductor wafer including a metal layer having a silver sub-layer, a substrate deposited over the metal layer, and a light emitting diode ("LED") layer deposited over the substrate; and
- a laser device, situated over the LED layer of the semiconductor wafer, configured to focus a high intensity laser beam at an area inside the substrate layer slightly away from the metal layer of the semiconductor wafer, wherein a portion of the high intensity laser beam penetrates a portion of an LED device in the LED layer without substantially affecting performance of the LED device.

13. The system of claim 12, wherein the high intensity laser beam is capable of destroying at least a portion of crystal lattice of the area.

14. The system of claim 12, wherein the LED layer includes a plurality of LED devices deposited over the substrate layer separated by a plurality of streets.

15. The system of claim 12, wherein the LED layer includes:
- a first conductive layer deposited over the substrate layer;
- an active layer deposited over the first conductive layer and configured to convert electrical energy to light; and
- a second conductive layer having a first surface overlying the active layer and a second surface opposite to the first surface to form a light-emitting semiconductor.

16. The system of claim 15,
wherein the first conductive layer is an n-type indium gallium nitride ("InGaN") layer; and
wherein the second conductive layer is a p-type InGaN layer.

17. The system of claim 15,
wherein the first conductive layer is an n-type gallium nitride ("GaN") layer; and
wherein the second conductive layer is a p-type GaN layer.

18. The system of claim 12, wherein the substrate layer is made of sapphire material having a range of thickness between 50 to 400 micrometers.

19. The system of claim 12, wherein the metal layer includes aluminum mirror sub-layer.

20. The system of claim 12, wherein the laser beam enters from a front side of the semiconductor wafer traveling through at least a portion of the substrate without substantial photon absorption.

* * * * *